(12) United States Patent
Lu et al.

(10) Patent No.: US 7,246,215 B2
(45) Date of Patent: Jul. 17, 2007

(54) SYSTOLIC MEMORY ARRAYS

(75) Inventors: Shih-Lien L. Lu, Portland, OR (US); Dinesh Somasekhar, Hillsboro, OR (US); Yibin Ye, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 368 days.

(21) Appl. No.: 10/721,178

(22) Filed: Nov. 26, 2003

(65) Prior Publication Data

US 2005/0114618 A1    May 26, 2005

(51) Int. Cl.
*G06F 12/00* (2006.01)

(52) U.S. Cl. ............... 711/169; 711/100; 711/101; 711/170; 710/3; 710/36; 710/38; 365/189.01; 365/230.03

(58) Field of Classification Search ................ 370/503; 711/169, 100, 101, 167, 170; 710/3, 36, 710/38; 365/189.01, 230.03
See application file for complete search history.

(56) References Cited

U.S. PATENT DOCUMENTS

| | | | | |
|---|---|---|---|---|
| 5,586,282 A * | 12/1996 | Iino et al. | .................. | 711/5 |
| 5,867,683 A * | 2/1999 | Witt et al. | .................. | 712/218 |
| 6,052,802 A * | 4/2000 | Zahir et al. | .................. | 714/47 |
| 6,173,356 B1 * | 1/2001 | Rao | .................. | 711/5 |
| 6,467,004 B1 * | 10/2002 | Iwamura et al. | ............. | 710/305 |
| 6,498,764 B1 * | 12/2002 | Won et al. | ............. | 365/230.03 |
| 6,505,269 B1 * | 1/2003 | Potter | .................. | 711/202 |
| 6,546,476 B1 * | 4/2003 | Gillingham | ................. | 711/167 |
| 6,732,247 B2 * | 5/2004 | Berg et al. | ................... | 711/169 |
| 7,047,385 B1 * | 5/2006 | Bhattacharya et al. | ...... | 711/169 |
| 7,071,748 B2 * | 7/2006 | Wich | ......................... | 327/176 |
| 2002/0156995 A1 * | 10/2002 | Martin et al. | ............... | 712/201 |
| 2002/0186589 A1 * | 12/2002 | Makuta et al. | ......... | 365/185.09 |
| 2003/0037226 A1 * | 2/2003 | Tsuruta et al. | .............. | 712/228 |
| 2003/0097541 A1 * | 5/2003 | Abrosimov et al. | ........... | 712/1 |
| 2004/0076044 A1 * | 4/2004 | Nowshadi | .................... | 365/200 |
| 2004/0100994 A1 * | 5/2004 | Miller | ........................ | 370/503 |
| 2004/0199739 A1 * | 10/2004 | Jeddeloh | ..................... | 711/169 |

OTHER PUBLICATIONS

H.T. Kung "Why Systolic Architectures?" IEEE 0018-9162/82/0100-0037500.75, Jan. 1982, pp. 37-46.

* cited by examiner

*Primary Examiner*—Stephen C. Elmore
*Assistant Examiner*—Daniel Kim
(74) *Attorney, Agent, or Firm*—Ked & Associates, LLP

(57) ABSTRACT

A short latency and high bandwidth memory includes a systolic memory that is sub-divided into a plurality of memory arrays, including banks and pipelines that access these banks. Shorter latency and faster performance is achieved with this memory, because each bank is smaller in size and is accessed more rapidly. A high throughput rate is accomplished because of the pipelining. Memory is accessed at the pipeline frequency with the proposed read and write mechanism. Design complexity is reduced because each bank within the memory is the same and repeated. The memory array size is re-configured and organized to fit within desired size and area parameters.

27 Claims, 8 Drawing Sheets

Read Address/Data Movement

Systolic Memory Array

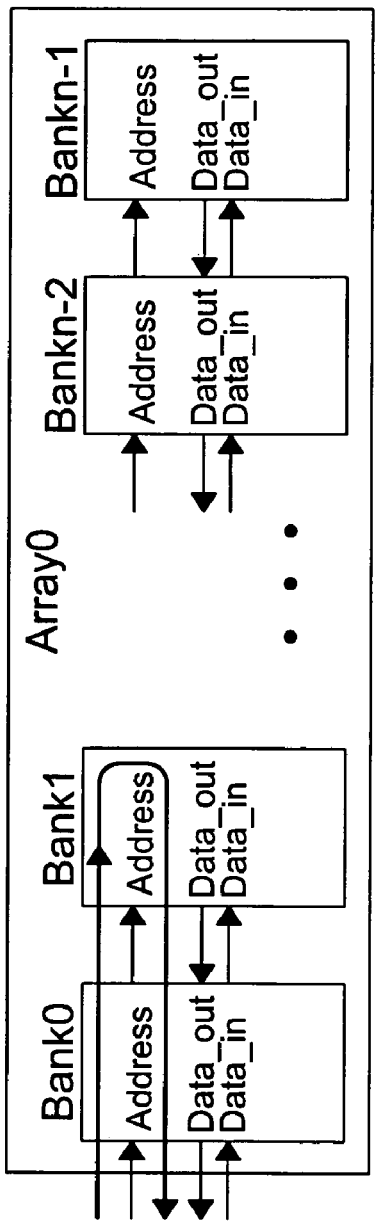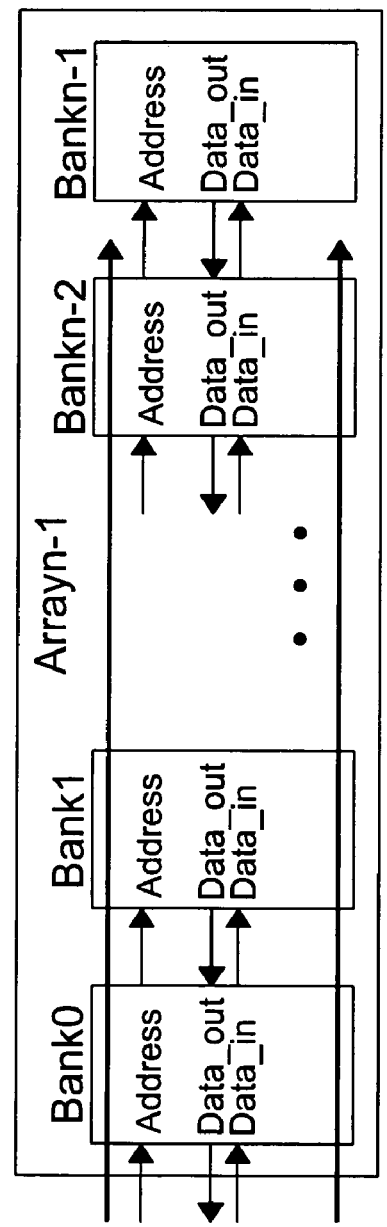
FIG. 2(a) Read Address/Data Movement
FIG. 2(b) Write Address/Data Movement Read After Write Write After Read

SYSTOLIC MEMORY ARRAYS

BACKGROUND OF THE INVENTION

1. Field of the Invention

The present invention is directed towards a systolic memory array (SMA) and more particularly to a systolic memory array (SMA) that enables the access of memory arrays that are subdivided into a plurality of banks and these banks may be accessed in a pipelined manner.

2. Background of the Related Art

One perennial goal among circuit and system designers is to improve memory bandwidth and access times. One way of achieving this goal, while simultaneously improving bandwidths and access times in memory devices, is to divide or compartmentalize an internal memory structure into a plurality of blocks that expand or increase the width of the data bus that accesses the memory structure.

Memory structures used in microprocessors and computing systems (e.g. a processor and memory) are growing rapidly in size and capability to accommodate the larger, proliferating new applications of increasing complexity and to improve processor performance. In general, systolic structures are used for mapping computations or processes into hardware structures and SMAs are used to map computations or processes into memory structures.

There is typically a direct relationship between a memory's capacity and its physical size, where a larger memory results in a larger physical size and a smaller memory results in a smaller physical size. This larger physical size increases the access time due to the inherent wiring delay present in longer wires and communication paths associated with the larger size. This makes accessing data and information stored in a memory structure within a short time or an otherwise acceptable time an increasingly difficult process.

Therefore, the various exemplary embodiments of the present invention address the disadvantages mentioned above and disclose a memory array that includes a plurality of multiple banks, which are adjustable in size (e.g. they can be made smaller or larger). These banks have shared address lines and are accessed in a pipelined fashion. After a certain latency or delay transpires, data stored in the banks at every clock cycle can be read out. Memory accesses to this memory array are sustainable for both reads and writes.

The various exemplary embodiments of the present invention permits memory arrays subdivided in banks to be accessed in a pipelined fashion. This approach achieves a much higher sustainable memory bandwidth and possibly a shorter average access time than what the individual banks provide if they were accessed with shared non-pipelined buses. This design also alleviates the problem of driving long global bit lines in larger memories. Read access of this type of pipelined memory will exhibit physical locality properties and have variable latency. Banks that are located closer to an access port will have shorter access time than banks that are located farther away. Additionally, systolic memories are easier to implement because of their modular designs and they are also more cost effective to produce because of this modular characteristic.

BRIEF DESCRIPTION OF THE DRAWINGS

The invention will be described in detail with reference to the following drawings in which like reference numerals refer to like elements wherein:

FIG. 2(a) is an exemplary illustration of an Read Address/Data Movement;

FIG. 2(b) is an exemplary illustration of a Write Address/Data Movement

DETAILED DESCRIPTION OF PREFERRED EMBODIMENTS

Additional advantages, and features of the invention will be set forth in part in the description which follows and in part will become apparent to those having ordinary skill in the art upon examination of the following or may be learned from practice of the invention. The advantages of the invention may be realized and attained as particularly pointed out in the appended claims.

A pipelined memory is a memory that is arranged in a pipelined manner. Those skilled in the art will appreciate that the various embodiments of the present invention may be implemented in different types of memory and storage media (e.g. DRAM, SRAM, magnetic, optical etc.).

The various exemplary embodiments of the present invention include a plurality of memory arrays that have a memory architecture similar to an apparatus architecture that is coupled to the plurality of memory arrays. For example, if the apparatus architecture is a pipelined microprocessor architecture, then the memory architecture that is coupled to the pipelined microprocessor architecture would utilize a pipelined architecture. Similarly, if the apparatus architecture is a non-pipelined microprocessor architecture, then the memory architecture that is coupled to the non-pipelined microprocessor architecture is also a non-pipelined architecture. In other words, the memory architecture is structured to be similar to the apparatus or device that is coupled to the memory.

A generic memory is organized and arranged into a two dimensional (2-D) array including rows and columns that are multiplexed together. In one exemplary embodiment, the array arrangement has word lines running horizontally and bit lines running vertically and the arrays of memory blocks are accessed independently. The memory is accessed by assigning a word address. Then the word address is decoded to activate a corresponding one of the word lines by using the bit lines and data is retrieved.

Data stored on a horizontal line is read out in parallel and the data may be reduced in width through a selection or grouping operation. In one exemplary embodiment, the memory array is sub-divided into banks horizontally. Two types of pipeline may be employed for performing this access.

Figure 1A:
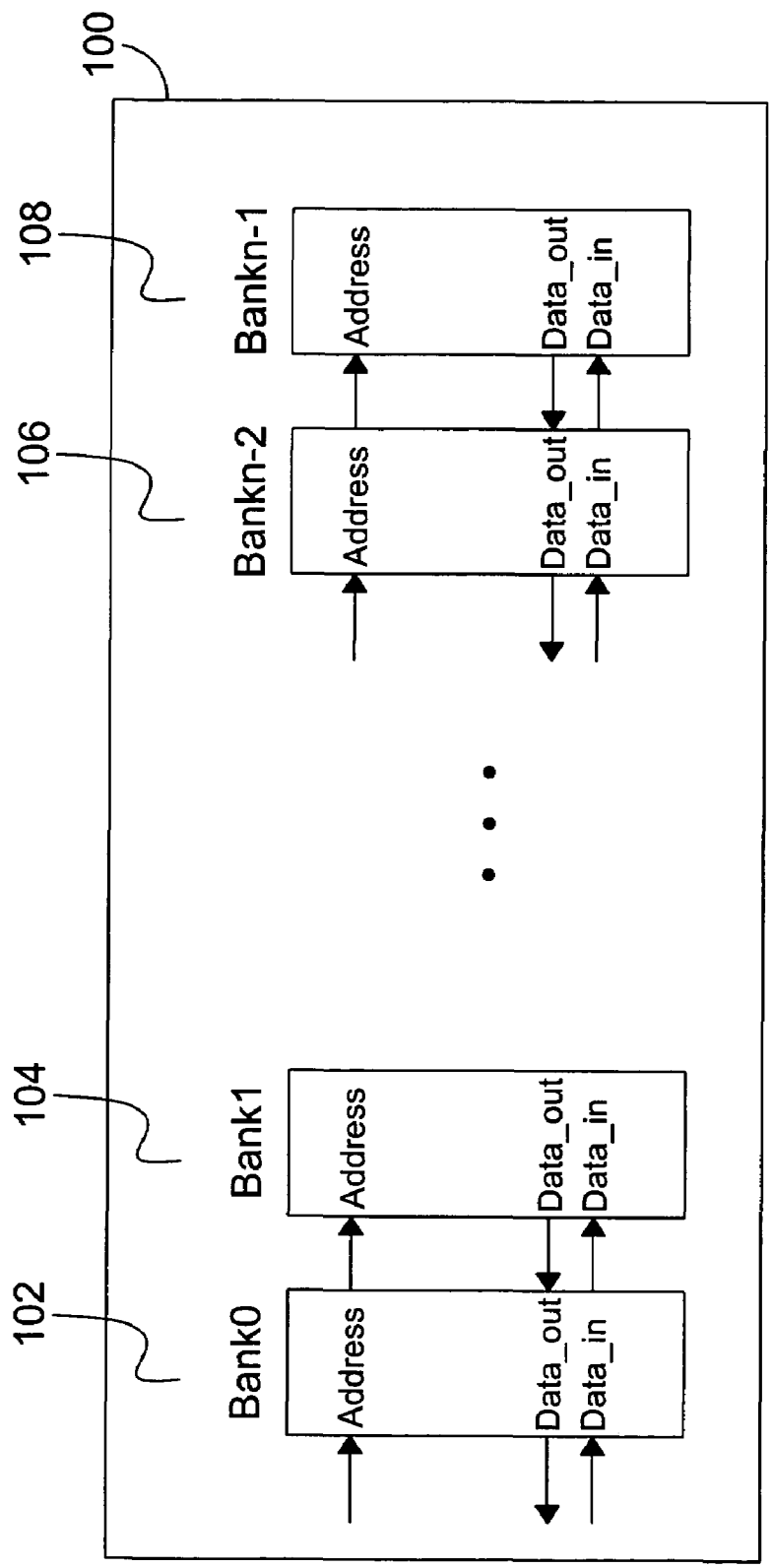
FIG. 1(a) is an exemplary embodiment of a pipelined memory array.

First, there is the address pipe that is used to pump the address into each bank in the memory array. Second, there is also another data pipe that allows the data to go in and out of the array. FIG. 1(a) illustrates one exemplary embodiment of this type of pipelined memory array.

In FIG. 1(a), Bank0 (102), Bank1 (104), . . . Bankn-2 (106), and Bankn-1 (108) are coupled together in a pipelined memory array 100 so that the memory bank locations are addressable and data can be read into and out of the memory without any data collisions occurring. Data is accessed in a predetermined order to dynamically prevent collisions from occurring. Timing diagrams are developed to reflect and characterize memory operations and one specific application of these timing diagrams is to help avoid these data collisions. The timing diagram also helps to characterize the flow of data into and out of the memory. Once the data flow is understood, data access can be predetermined in accordance with this data flow to avoid collisions and allow the memory to function in a more optimized manner.

During operation, the pipelined memory operates like a pipelined processor and some of the same operating principles that have been applied to pipelined processors (e.g. super-scalar processing and out of order processing) are applied to memory structures and their operation in accordance with the various embodiments of the present invention. The pipelined memory will support out-of-order data read, write and access operations.

Those skilled in the art will realize that there is no need to restrict the pipeline to one-dimension only. Multiple dimension pipelines can be employed to overcome the long wiring delay problem and still remain within the spirit and scope of the claimed embodiments of the present invention.

Figure 1B:
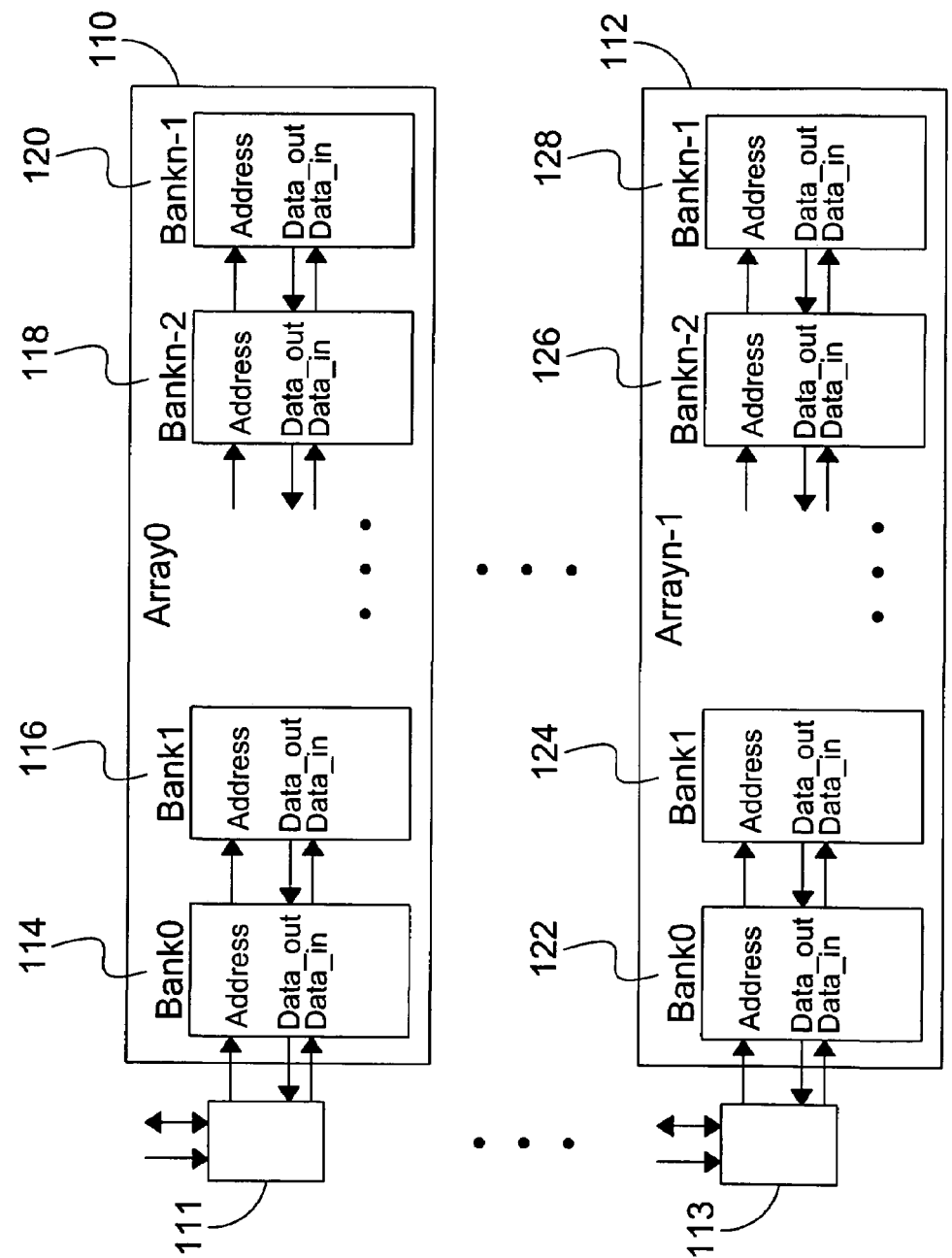
FIG. 1(b) is an exemplary embodiment of a systolic memory array.
Figure 3:
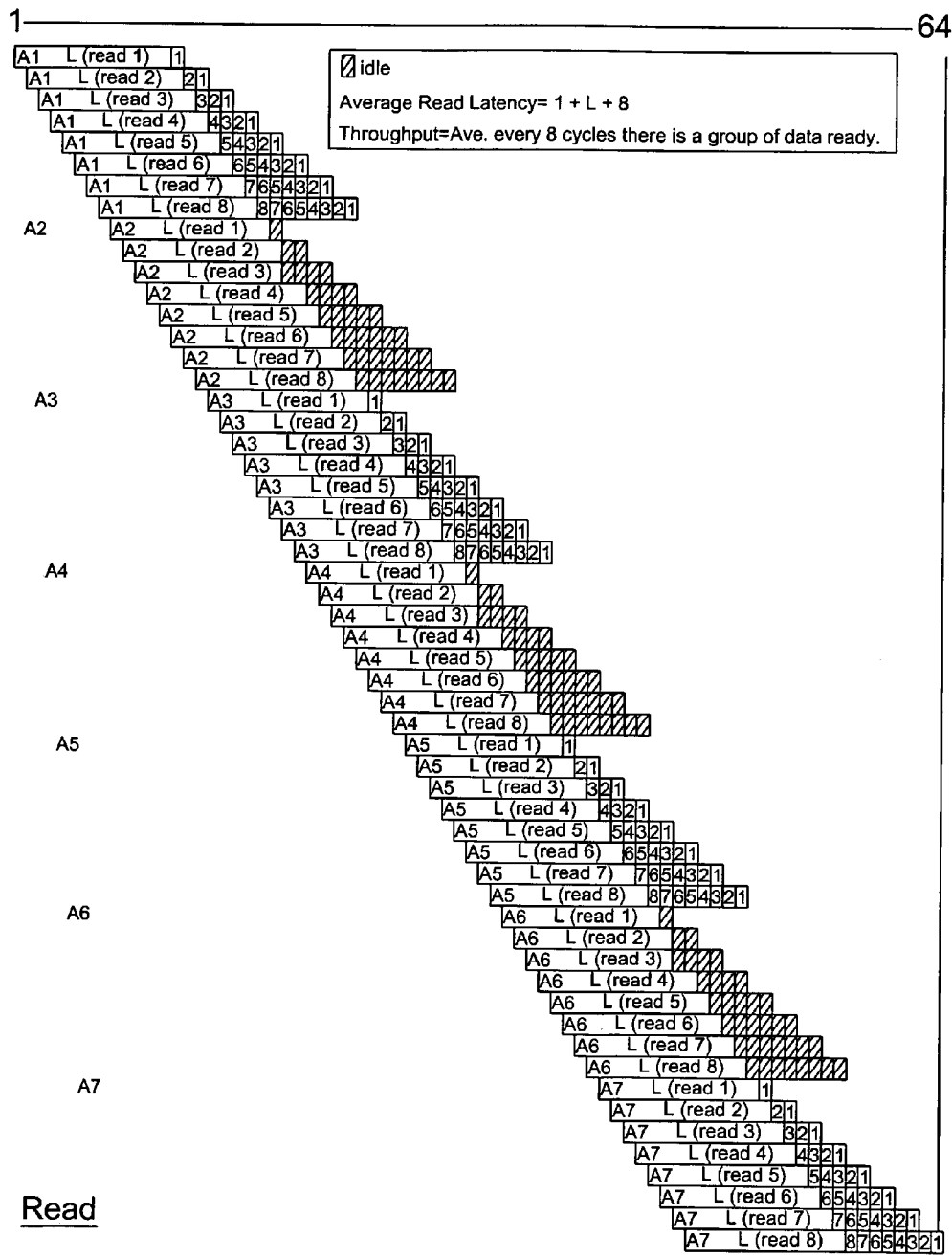
FIG. 3 is an exemplary timing diagram of read pipeline timing.
Figure 4:
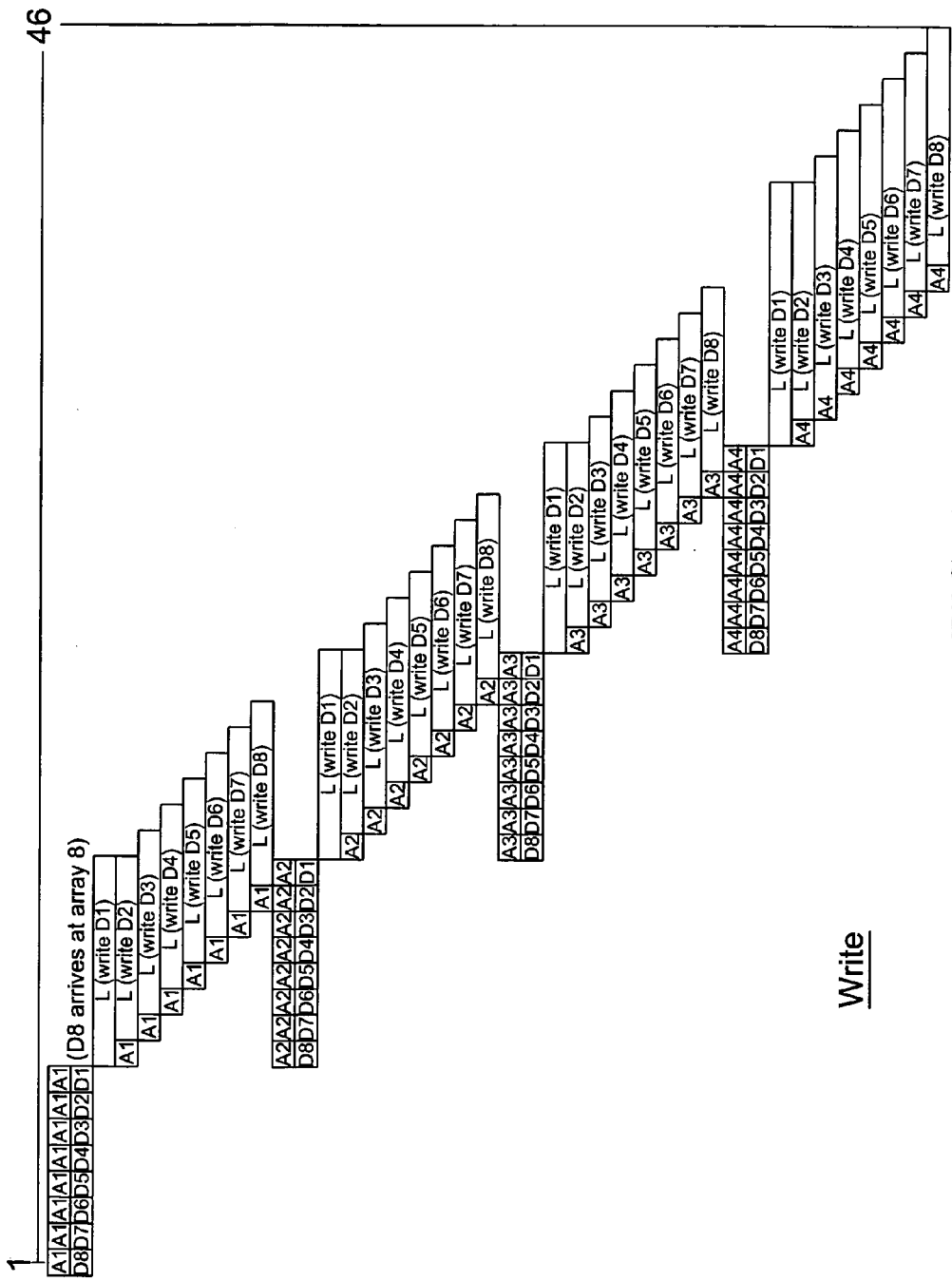
FIG. 4 is an exemplary timing diagram of write pipeline timing.
Figure 5:
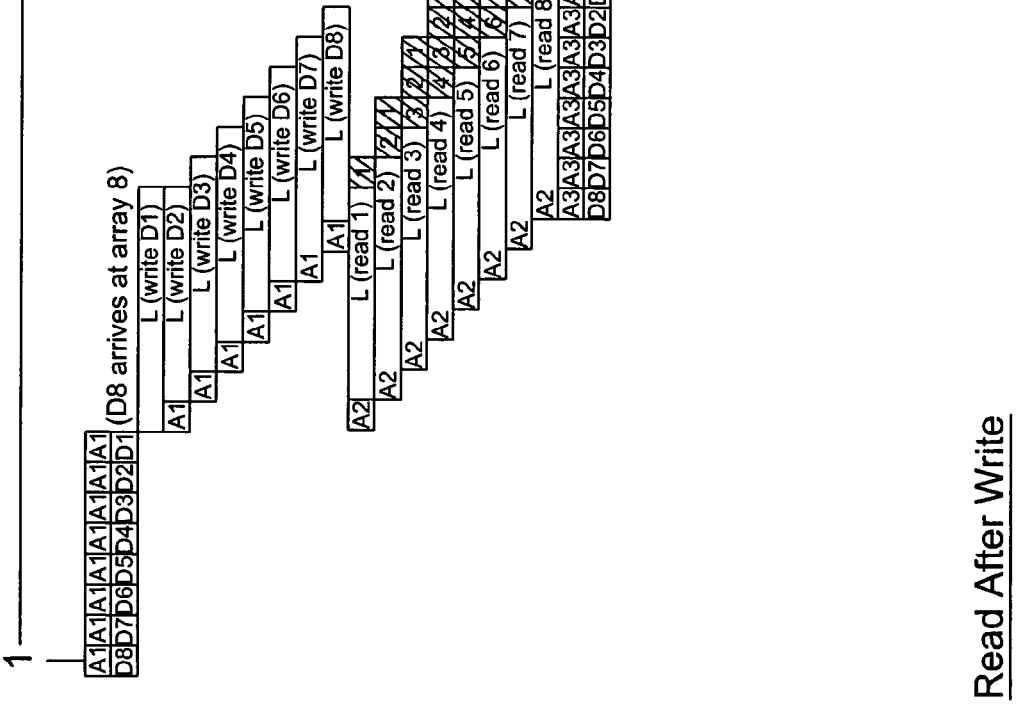
FIG. 5 is an exemplary timing diagram of a read after write operation.
Figure 6:
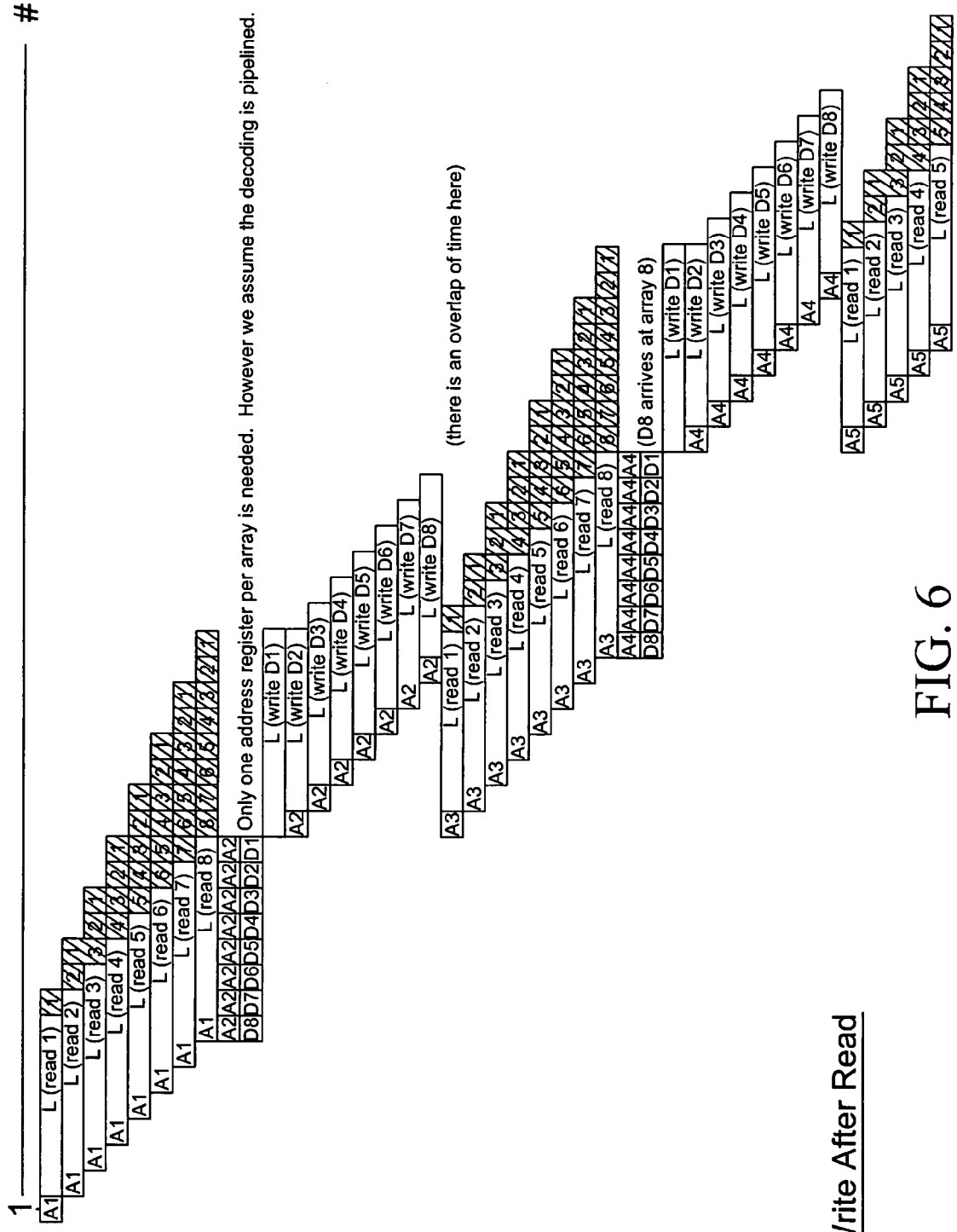
FIG. 6 is an exemplary timing diagram of a write after read operation.

FIG. 1(b) illustrates an exemplary embodiment of how multiple arrays can also be pipelined vertically. In FIG. 1(b), two systolic memory arrays, Array0 (110) and Arrayn-1 (112) are shown. In Array0 (110), Bank0 (114), Bank1(116), . . . Bankn-2 (118), and Bankn-1 (120) are coupled together in a pipelined memory array so that the memory bank locations are addressable and data can be read into and out of memory. A pipeline register 111 interfaces with Array0 and pipeline register 113 interfaces with Arrayn-1.

In Arrayn-1 (112), Bank0 (122), Bank1 (124), . . . Bankn-2 (126), and Bankn-1 (128) are coupled together in a pipelined memory array so that the memory bank locations are addressable and data can be read into and out of memory. A pipeline register 113 is used to interface with Array0.

One advantage of the exemplary design illustrated is that all peripheral access is from one side (in this case the left side as shown in FIG. 1(b)). In this exemplary embodiment, at least two data pipes are needed—one data pipe is used for reading and one data pipe is used for writing. This is done to reduce the read-write and write-read turn-around time and avoid the contention of resources. However, those skilled in the art will realize that additional numbers of data pipes for reading and writing operations and interfacing with the memory arrays may also be used, without departing from the spirit and scope of the present invention.

Each bank will have a mechanism for supporting addressing and data operations (e.g. pipeline registers for supporting addressing and data operations). The number of pipeline stages selected depends on the access latency of each bank and the desired throughput rate.

For a given throughput requirement, a clock frequency and the data pipe width for the pipeline are determined. The individual bank access latency is converted into a number of pipeline clock cycles. In one exemplary embodiment, there should be the same number of pipeline stages as the number of clock cycles.

For example, if the desired throughput is 8 GB per second and the datapath width is 8B, then the clock frequency is 1 GHz. If the access latency is 8 nano-seconds, then there will be 8 pipeline stages. Writing is done by pumping the address together with the data to be written.

Data for the tight most bank enters the pipeline first, while data for the left most bank enters last. However, the bank to the left is written first while the bank on the right is written last. Reading is done by pumping the address once and allowing the address to flow through the address pipe to reach individual banks one cycle at a time. Whenever a bank receives the read address, access to the bank is started. Therefore, the access latency for an ith bank is represented by 2i+L. It will take i cycles to allow the address to reach the desired ith bank. It will take L cycles of latency to access the memory. It will take i cycles again, to allow the data to come out from the ith bank through the read data pipeline. When data is ready at the bank memory, it needs to enter the read data pipeline.

In order to avoid data collision during memory operation, the second read access of a plurality of consecutive reads must delay the placement of read result on the read data pipeline by one cycle. This delay is represented in the timing diagrams by the idle time that is inserted into the memory operation. This will ensure that no data collisions will occur. Notice that results from different banks having different addresses will be interleaved.

FIG. 2 depicts an exemplary illustration of the read and write processes. FIG. 2(a) shows the read operations. Each address of the bank arrives at the designated bank and the data is read out from there and placed on the data bus after the array access time. The thick arrow shown in the figure illustrates an exemplary address/data path.

FIG. 2(b) illustrates the write operation. Addresses continue to enter into the array and a corresponding data travel on the data bus in sync with the address. A control signal (not shown) enables the write process to occur at the appropriate time.

FIGS. 3-6 that follow illustrate various timing diagrams of an exemplary pipelined memory for different types of memory accesses.

The various exemplary embodiments of the present invention that will be discussed have 8 banks in each array. Those skilled in the art will appreciate that more than 8 banks may be used without departing from the spirit and scope of the present invention. In these Figures, the horizontal axis is time. Data at the ith bank is denoted as Di. Addresses entering the pipeline are labeled as Ai. For example A1 is the first access address that a user would like to address, while A2 is the second access address to be addressed and so on. In this example, data coming out from odd addresses (A1, A3 . . . ) will interleave with data from even addresses (A2, A4 . . . ) after initial filling of the pipe.

The data and addresses are in the following order—D1 (A1), D2(A1), D3(A1), D4(A1), D5(A1), D1(A2), D6(A1), D2(A2), D7(A1), D3(A2), D8(A1), D4(A2), D1(A3), D, D5(A2) . . . In this exemplary embodiment, every 8 cycles, a new address can enter this pipelined array memory. Data can be read out and written at every cycle after an initial latency.

In these exemplary timing diagrams, L refers to a latency associated with each of the memory banks. The specific latency value that is ultimately selected should be the same for each bank. However, those skilled in the art will appreciate that different latencies may be selected for different memory arrangements, schemes or layouts, without departing from the spirit and scope of the present invention.

Figure 7:
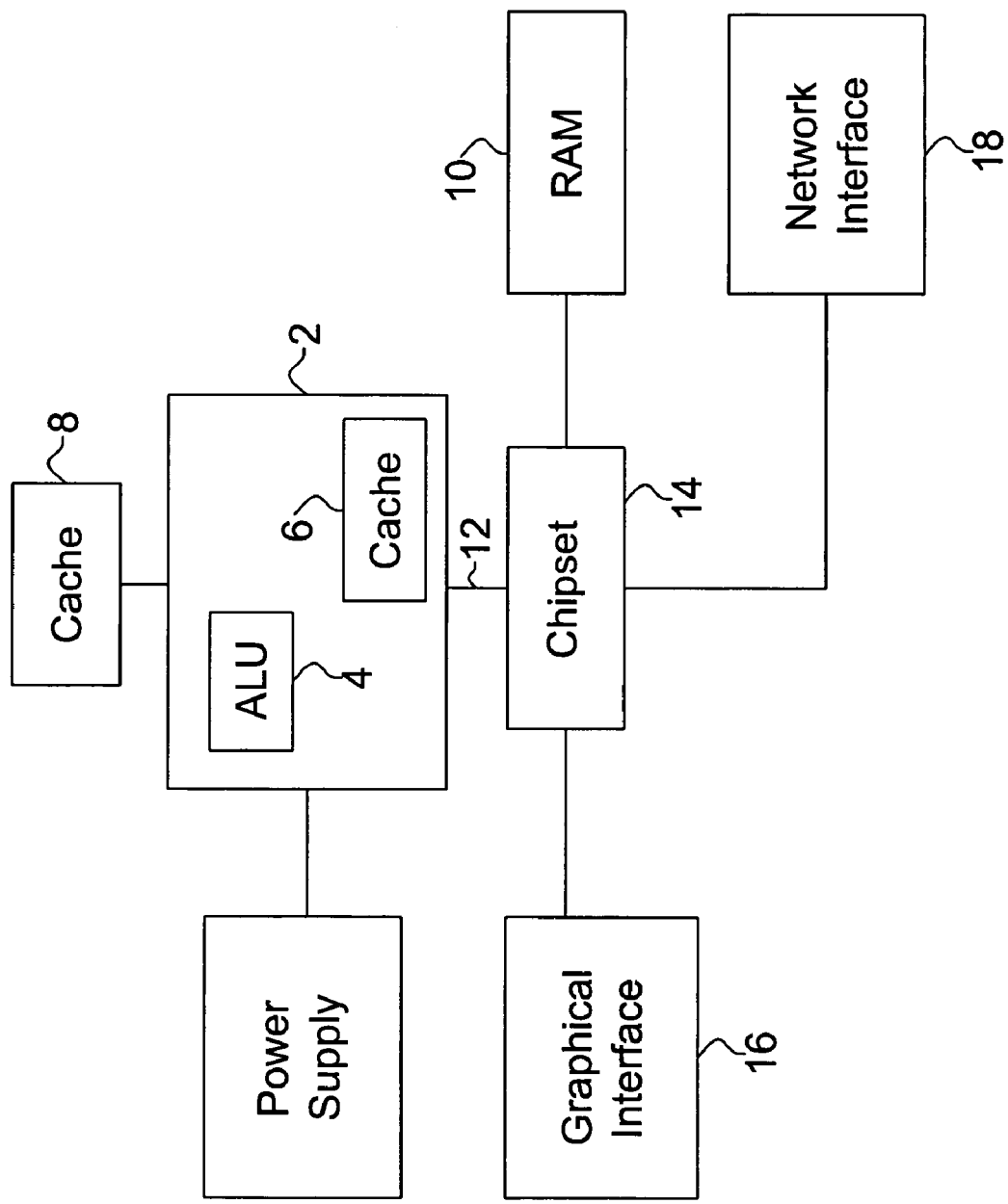
FIG. 7 is an exemplary diagram of an exemplary computer system implementing a systolic memory array.

FIG. 7 is an exemplary diagram of an exemplary computer system including storage media using systolic memory arrays in accordance with the exemplary embodiments of the present invention. The computer system may include a microprocessor 2, which includes many sub-blocks, such as an arithmetic logic unit (ALU) (4) and an on-die cache 6. The microprocessor 2 may also communicate to other levels of cache, such as off-die cache 8. Higher memory hierarchy levels such as system memory 10 (e.g. RAM), are accessed via a host bus 12 and chipset 14. In addition, other off-die functional units, such as a graphical interface 16 and network interface 18, to name just a few, may communicate and interoperate with the microprocessor 2.

A systolic memory array in accordance with the various exemplary embodiments of the present invention may be used in the on-die cache 6, the off-die cache 8 and the RAM 10 or in any other location that memory or storage media is used in the computer system.

The foregoing embodiments and advantages are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. A memory comprising:
   a plurality of systolic memory arrays each divided into banks, each of the memory arrays arranged in a pipelined architecture and each of the plurality of systolic memory arrays to support pipeline access to the corresponding banks using a plurality of data pipes; and
   a plurality of pipeline registers, each register to couple to a first one of the banks of a corresponding one of the plurality of systolic memory arrays to provide read and write operations through a data pipe to the banks of the corresponding one of the systolic memory arrays beginning with the first one of the banks and to provide address access through an address pipe to the banks of the corresponding one of the systolic memory arrays beginning with the first one of the banks.

2. The memory of claim 1, wherein at least one of the plurality of data pipes is used for a reading operation.

3. The memory of claim 1, wherein at least one of the plurality of data pipes is used for a writing operation.

4. The memory of claim 1, each of the plurality of systolic memory arrays includes at least eight banks.

5. The memory of claim 1, wherein a number of pipeline stages used depends upon an access latency of each bank and a desired throughput rate.

6. The memory of claim 1, wherein a clock frequency and a data path width for the pipeline architecture is determined.

7. The memory of claim 1, wherein a number of pipeline stages relates to a number of clock cycles.

8. The memory of claim 7, wherein the number of pipeline stages is the same as the number of clock cycles.

9. The memory of claim 1, wherein each of the plurality of systolic memory arrays is divided into a horizontal arrangement.

10. The memory of claim 1, wherein each of the plurality of systolic memory arrays is divided into a vertical arrangement.

11. A memory comprising:
    a plurality of systolic memory arrays each divided into banks, each of the systolic memory arrays arranged in a pipelined architecture and each of the plurality of memory arrays to support pipeline access to the corresponding banks using a plurality of data pipes, and a writing operation into the memory is performed by pumping an address with data that is to be written into the memory; and
    a plurality of pipeline registers, each register to couple to a first one of the banks of a corresponding one of the plurality of systolic memory arrays through a data pipe and an address pipe to provide read/write data input, data output and address access to the banks of the corresponding one of the systolic memory arrays through the first one of the banks arranged in the pipelined architecture.

12. The memory of claim 1, wherein a read operation from the memory is performed by pumping an address once and allowing the address to flow through the address pipe to reach individual banks of one of the systolic memory arrays one cycle at a time.

13. The memory of claim 1, wherein memory operations from different banks having different memory addresses of one of the systolic memory arrays are interleaved.

14. The memory of claim 11, wherein peripheral access for one systolic memory array is accomplished from one side of the one systolic memory array.

15. The memory of claim 1, wherein whenever a bank receives a read address, memory access is initiated.

16. The memory of claim 1, wherein access latency for a bank is represented by 2i+L, where i represents the time it takes to allow an address to reach a desired i th bank and L represents the-cycles of latency to access the memory.

17. The memory of claim 16, wherein it will take i cycles to allow data to come out of the i th bank through a read pipeline.

18. The memory of claim 16, wherein to avoid memory collisions among data, a second read access of consecutive reads delays the-placement of read result on the read data pipeline by a specified idle time.

19. The memory of claim 18, wherein the specified idle time is at least one clock cycle.

20. A processing system comprising:
    a die including a microprocessor;
    peripheral equipment coupled to the processing system;
    a network interface; and
    on-die or off-die systolic memory including:
    a plurality of separate systolic memory arrays, each systolic memory array including a plurality of memory banks in a pipelined fashion, the plurality of memory banks of each systolic memory array to share an address line in a pipelined fashion and data lines in a pipelined fashion, and a read operation from the systolic memory is performed by pumping an address once and allowing the address to flow through an address pipe to reach individual banks one cycle at a time, and
    a plurality of pipeline registers. each register coupled to one of the separate systolic memory arrays, and each register is coupled to one end of a corresponding one of the systolic memory arrays to provide read data from the memory array, to provide write data to the array and to provide address information to the array.

21. The processing system of claim 20, wherein each bank is associated with a mechanism to support addressing and data operations.

22. The processing system of claim 20, wherein access latency for a bank is represented by 2i+L, where i represents the time it takes to allow an address to reach a desired i th bank and L represents the-cycles of latency to access the memory.

23. The memory of claim 1, wherein each bank is associated with a mechanism to support addressing each data operations of the corresponding bank.

24. A memory comprising:
a plurality of separate systolic memory arrays, each systolic memory array including a plurality of memory banks in pipelined fashion, the plurality of memory banks of each memory array to share an address line in a pipelined fashion and data lines in a pipelined fashion, and a read operation is performed by pumping an address and allowing the address to flow through the address line to reach individual banks of one of the plurality of separate systolic memory arrays one cycle at a time, and access latency for one bank of one of the plurality of senarate systolic memory arrays is represented by 2i+L, where i represents time it takes to allow an address to reach a desired i th bank and L represents cycles of latency to access the memory.

25. The memory of claim 24, further comprising:
a plurality of pipeline registers, each register to couple to one of the separate systolic memory arrays.

26. The memory of claim 24, wherein each bank is associated with a mechanism to support addressing and data operations.

27. A memory comprising:
a plurality of separate systolic memory arrays, each systolic memory array including a plurality of memory banks in pipelined fashion, the plurality of memory banks of each systolic memory array to share an address line in a pipelined fashion and data lines in a pipelined fashion, and peripheral access for writing operations and addressing for one systolic memory array is accomplished from one side of the one systolic memory array and data for reading operations for the one systolic memory array is received from the one side of the one systolic memory array.

* * * * *